United States Patent
Taskin et al.

(10) Patent No.: US 7,196,554 B2
(45) Date of Patent: Mar. 27, 2007

(54) INTEGRATED CLOCK SUPPLY CHIP FOR A MEMORY MODULE, MEMORY MODULE COMPRISING THE INTEGRATED CLOCK SUPPLY CHIP, AND METHOD FOR OPERATING THE MEMORY MODULE UNDER TEST CONDITIONS

(75) Inventors: Nazif Taskin, Munich (DE); Manfred Pröll, Dorfen (DE); Manfred Dobler, Ergoldsbach (DE); Gerald Resch, Munich (DE)

(73) Assignee: Infineon Technologies AG, Munich (DE)

( * ) Notice: Subject to any disclaimer, the term of this patent is extended or adjusted under 35 U.S.C. 154(b) by 79 days.

(21) Appl. No.: 10/886,523

(22) Filed: Jul. 7, 2004

(65) Prior Publication Data

US 2005/0041519 A1 Feb. 24, 2005

(30) Foreign Application Priority Data

Jul. 7, 2003 (DE) .............................. 103 30 593

(51) Int. Cl.
*H03K 17/00* (2006.01)
(52) U.S. Cl. ........................................ 327/99; 327/407
(58) Field of Classification Search ............ 327/47–49, 327/99
See application file for complete search history.

(56) References Cited

U.S. PATENT DOCUMENTS

| 4,463,440 | A |   | 7/1984  | Nishiura et al. ............ 713/400 |
| 5,097,489 | A |   | 3/1992  | Tucci .......................... 375/374 |
| 5,272,390 | A |   | 12/1993 | Watson, Jr. et al. ........ 327/141 |
| 5,371,764 | A |   | 12/1994 | Gillingham et al. ........ 375/354 |
| 5,406,590 | A | * | 4/1995  | Miller et al. ................. 375/376 |
| 5,414,381 | A |   | 5/1995  | Nelson et al. ............... 327/262 |
| 5,432,823 | A |   | 7/1995  | Gasbarro et al. ........... 375/356 |
| 5,440,514 | A |   | 8/1995  | Flannagan et al. .......... 365/194 |
| 5,604,452 | A | * | 2/1997  | Huang .......................... 327/99 |
| 5,657,481 | A |   | 8/1997  | Farmwald et al. .......... 713/400 |
| 5,764,712 | A |   | 6/1998  | Branstad et al. ............ 375/376 |
| 5,812,832 | A |   | 9/1998  | Horne et al. ................. 713/501 |
| 6,005,904 | A | * | 12/1999 | Knapp et al. ............... 375/376 |
| 6,127,858 | A | * | 10/2000 | Stinson et al. ................ 327/99 |

(Continued)

OTHER PUBLICATIONS

Kushiyama, N., et al., "A 500-Megabyte/s Data-Rate 4.5M DRAM," IEEE Journal of Solid-State Circuits, Apr. 1993, vol. 28, No. 4, pp. 490-498.

*Primary Examiner*—Timothy P. Callahan
*Assistant Examiner*—Hai L. Nguyen
(74) *Attorney, Agent, or Firm*—Slater & Matsil, L.L.P.

(57) ABSTRACT

An integrated chip has a clock signal input (1.1) for application of a first clock signal (clk1) and a clock signal output (1.2–1.5). Moreover, it has a phase locked loop (2), which, on the input side, is connected to the clock signal input (1.1) and serves far generating a second clock signal (clk2). Furthermore, the chip has a multiplexer (MUX), via which the first clock signal (clk1) or the second clock signal (clk2) can optionally be switched to the clock signal output (1.2–1.5), and a unit for frequency monitoring (3), which, on the input side, is connected to the clock signal input (1.1) and is designed and can be operated in such a way that, in the event of a limiting frequency (fmin) being undershot, the multiplexer (MUX) is caused to switch the first clock signal (clk1) to the clock signal output (1.2–1.5).

16 Claims, 1 Drawing Sheet

U.S. PATENT DOCUMENTS

| | | | |
|---|---|---|---|
| 6,172,537 B1 * | 1/2001 | Kanou et al. | 327/99 |
| 6,239,626 B1 * | 5/2001 | Chesavage | 327/99 |
| 6,392,494 B2 * | 5/2002 | Takeyabu et al. | 331/11 |
| 6,424,193 B1 * | 7/2002 | Hwang | 327/158 |
| 6,528,974 B1 | 3/2003 | Mirov et al. | 323/267 |
| 6,538,489 B2 * | 3/2003 | Nakano | 327/297 |
| 6,657,919 B2 | 12/2003 | Foss et al. | 365/233 |
| 6,834,093 B1 * | 12/2004 | Chiu | 377/39 |
| 6,876,239 B2 * | 4/2005 | Bell | 327/158 |
| 6,879,188 B2 * | 4/2005 | Miyazaki et al. | 327/105 |
| 6,891,409 B2 * | 5/2005 | Furuya | 327/141 |

\* cited by examiner

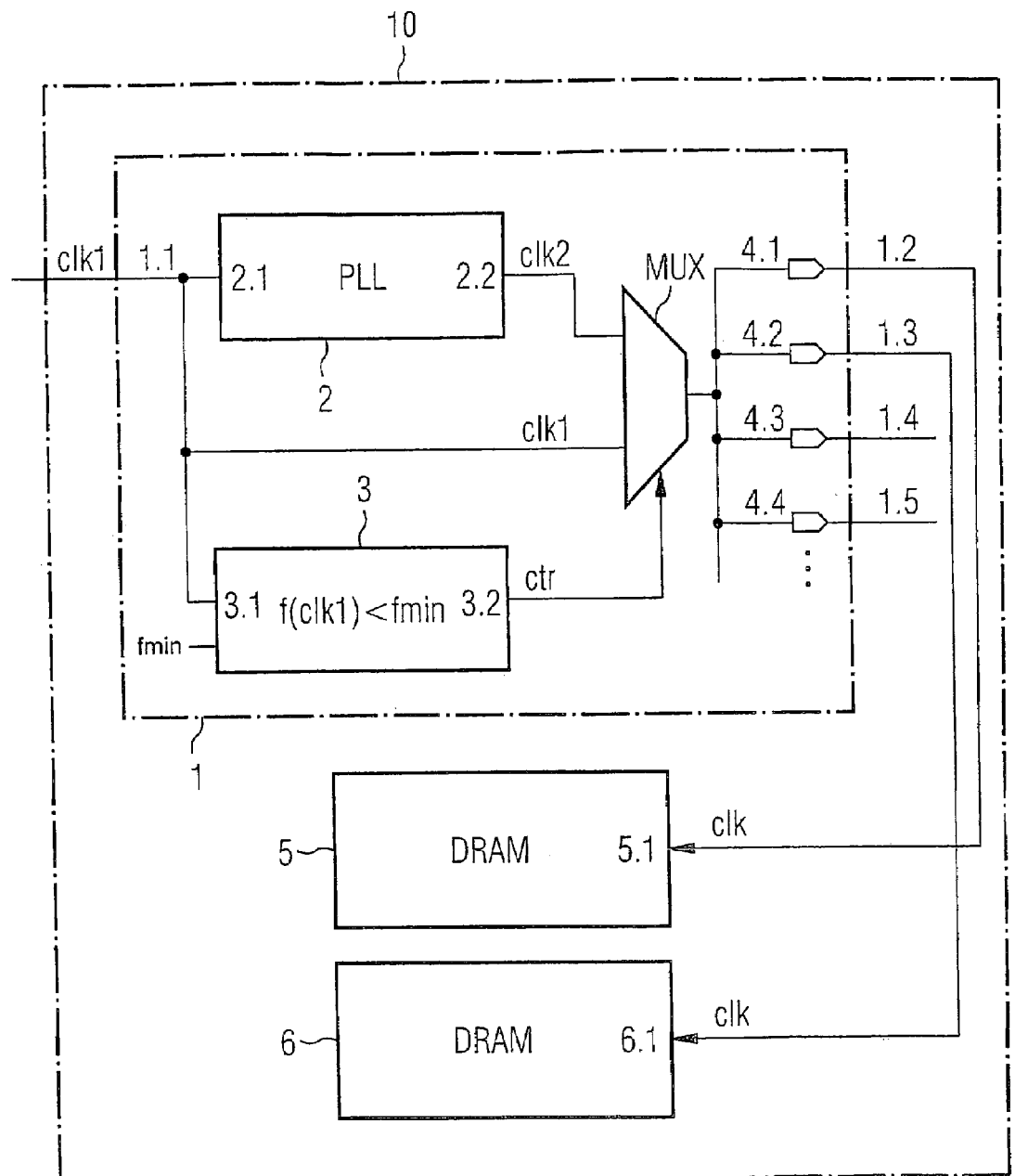

INTEGRATED CLOCK SUPPLY CHIP FOR A MEMORY MODULE, MEMORY MODULE COMPRISING THE INTEGRATED CLOCK SUPPLY CHIP, AND METHOD FOR OPERATING THE MEMORY MODULE UNDER TEST CONDITIONS

This application claims priority to German Patent Application 103 30 593.9, which was filed Jul. 7, 2003 and is incorporated herein by reference.

TECHNICAL FIELD

The invention relates to an integrated clock supply chip for a memory module, a memory module comprising the integrated clock supply chip, and a method for operating the memory module under test conditions.

BACKGROUND

A memory module generally comprises a plurality of integrated memory chips soldered on a memory module circuit board. Moreover, further integrated chips, containing for example registers, buffers and a phase locked loop (PLL), may be arranged on the circuit board of the memory module. In order to be able to connect the memory module to a computing unit, the memory module circuit board has connections along one of its longitudinal sides. These connections can then be used to plug the memory module as main memory, for example, into a PC receptacle provided therefor. The various embodiments of the memory modules are standardized in module families and available with different storage capacities.

Single inline memory modules (SIMMs), for example, form one of the standardized embodiments. They have 72 connections and are available either with a data width of 32 bits for applications without a parity bit or with a data width of 36 bits for applications with a parity bit. So-called dual inline memory modules (DIMMs) represent a further standard in the module families of the memory modules and are a further development of the SIMM family. By comparison with the SIMM modules, in which the integrated memory chips are arranged only on one side of the circuit board, the integrated memory chips can be arranged on the front and rear sides of the circuit board in the case of the DIMM modules. DIMM modules have, for example, 168 connections or even more connections, half of them being arranged on the front side and the other half thereof being arranged on the rear side of the circuit board. The DIMM modules have the advantage of double the data width, inter alia, by comparison with SIMM modules.

Buffered DIMM modules and also non-buffered DIMM modules are known. The buffered DIMM modules are equipped with a buffer which, by means of an integrated buffer chip, amplifies the address, command and clock signals which are used to drive the individual integrated memory chips on the DIMM module. As a result, it is possible to reduce unavoidable input capacitances. This is important primarily when the intention is to realize systems having many receptacles for DIMM modules, as is the case with servers, for example. So-called registered DIMM modules represent a further development of buffered DIMM modules. In the case of registered DIMM modules, the address and command signals are amplified by integrated register chips, while the clock signals are amplified by an integrated clock supply chip containing a phase locked loop. The clock supply chip with the phase locked loop also simultaneously serves for driving the registers in order that the address and command signals to be accepted are stored in the registers in a correctly timed manner.

Dynamic memories, also referred to as dynamic random access memory (DRAM), are generally used as integrated memory chips.

Since the phase locked loop in the integrated chip operates only within a specific frequency range, for example around +/−30% above or below the typical operating frequency of the PLL, the registered DIMM module cannot be operated or tested at a frequency which lies below the lower limiting frequency of the phase locked loop.

A typical productive test program also encompasses, inter alia, the retention time, that is to say the time duration during which data are maintained in a dynamic memory chip (DRAM) without renewed refreshing. The detection of the retention time requires long test times, which are independent of the operating frequency of the integrated memory chip. In principle, during tests it is desirable to test the memory chips on cost-effective test systems, but the latter can only provide low test frequencies. The consequence of this, however, is that the phase locked loop no longer operates properly. Therefore, the tests must necessarily be carried out with the aid of expensive test systems, which can provide the clock frequency required for operation of the PLL. The productive test is regularly effected during or at the end of the production of the DIMM modules in order to ascertain the functionality thereof and to determine their specification.

In the event of analyzing registered DIMM modules for defects, for example in order to determine the cause of a failure of the module or its components in the event of a return from the customer, the defect analysis is carried out by means of a more cost-effective test system, which can therefore only provide low clock frequencies. In this case, for the defect analysis, the relevant integrated memory chips have to be unordered from the registered DIMM module and be individually tested. On the one hand, the desoldering operation is associated with a considerable expenditure of time. On the other hand, parameters within the memory chip may be attenuated again or even eliminated, inter alia, as a result of annealing, which makes the analysis more difficult or impossible.

SUMMARY OF THE INVENTION

In one aspect, the invention specifies an integrated clock supply chip for a memory module, such that tests and/or defect analyses are also possible at low clock frequencies. In particular, the intention is to be able to test the retention time. In particular, the intention is to enable defect analyses for registered DIMM modules with a low outlay.

Furthermore, a memory module of the preferred embodiment can still readily be tested even at low clock frequencies without the individual memory chips having to be removed from the memory module.

In addition, aspects of the invention specify a method for operating a memory module under test conditions, which enables the memory module also to be tested at low clock frequencies.

The integrated clock supply chip according to the preferred embodiments of the invention has a clock signal input for application of a first clock signal and a clock signal output. Moreover, it has a phase locked loop, which, on the input side, is coupled to the clock signal input and serves for generating a second clock signal. Furthermore, the clock supply chip has a multiplexer, via which the first clock signal or the second clock signal can optionally be switched to the clock signal output, and a unit for frequency monitoring, which, on the input side, is coupled to the clock signal input and is designed and can be operated in such a way that, in the event of a limiting frequency being undershot, the multiplexer is caused to switch the first clock signal to the clock signal output.

The memory module according to the preferred embodiments of the invention includes an integrated clock supply chip having a clock signal input for application of a first clock signal and a clock signal output. Furthermore, the integrated clock supply chip has a phase locked loop, which, on the input side, is coupled to the clock signal input and serves for generating a second clock signal. Moreover, a multiplexer is provided in the integrated clock supply chip, via which multiplexer the first clock signal or the second clock signal can optionally be switched to the clock signal output. Finally, the integrated clock supply chip has a unit for frequency monitoring, which, on the input side, is coupled to the clock signal input and which is designed and can be operated in such a way that, in the event of a limiting frequency being undershot, the multiplexer is caused to switch the first clock signal to the clock signal output. The memory module additionally includes a memory chip, the clock input of which is coupled to the clock signal output.

The preferred embodiment's method for operating a memory module under test conditions has the following features. A first clock signal having a defined, predetermined clock frequency is applied to the memory module. The clock frequency is monitored by means of a unit for monitoring the frequency and, if the clock frequency undershoots a lower limiting frequency, instead of a second clock signal generated by a phase locked loop of the memory module, the first clock signal is passed to the clock inputs of the memory chips of the memory module.

In one embodiment of the invention, the integrated chip has an output driver connected downstream of the multiplexer. This has the advantage that the clock signal generated by the integrated clock supply chip is available with sufficiently good quality even in the case of a relatively high load, caused by a plurality of memory chips connected to the integrated clock supply chip.

Preferably, the integrated clock supply chip is used for generating the clock signal for an integrated memory chip.

In one development of the memory module according to the invention, the integrated clock supply chip has an output driver connected downstream of the multiplexer. As a result, a plurality of memory chips present on the memory module can be supplied with a sufficiently good clock signal.

In a further embodiment, the memory module according to the invention has a dynamic memory as memory chip.

In an additional development of the invention, the memory module is designed as a dual inline memory module.

In one development of the invention's method for operating the memory module under test conditions, the memory chip on the memory module is tested after the clock signal having a desired, impressed frequency has been provided with the aid of the integrated clock supply chip. The clock signal is generated by the tester and amplified in the phase locked loop of the integrated clock supply chip, and adapted in its phase in order to be fed, on the one hand, to the memory chips and, on the other hand, to the registers for defining the buffer-storage of address and command data.

BRIEF DESCRIPTION OF THE DRAWINGS

The invention is explained in more detail below using a plurality of exemplary embodiments with reference to a figure.

The FIGURE shows the basic construction of the integrated chip according to the preferred embodiment of the invention and also the memory module in the form of a block diagram.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The FIGURE illustrates a memory module 10 that includes two memory chips 5 an 6. In addition to the integrated memory chips 5 and 6 embodied as DRAMs, the memory module 10 illustrated in the figure also includes an integrated circuit 1 for generating the clock signal clk required for the two memory chips 5 and 6. For this purpose, the integrated chip 1 has a clock signal input 1.1, at which a first clock signal clk1 is present. The first clock signal clk1 is passed both to the input 2.1 of a phase locked loop 2 and to an input of a multiplexer MUX and to the input 3.1 of a unit for frequency monitoring 3. With the aid of the unit for frequency monitoring 3, the clock frequency f(clk1) of the clock signal clk1 present at the input 1.1 is determined and compared with a limiting frequency fmin.

If the clock frequency f(clk1) is less than the limiting frequency fmin, the unit for frequency monitoring 3 generates at its output 3.2 a control signal center ctr, which causes the multiplexer MUX to switch through to the multiplexer output the clock signal clk1 present at one of its multiplexer inputs. If the clock frequency f(clk1) of the clock signal clk1 is greater than the limiting frequency fmin, the unit for frequency monitoring 3 causes the multiplexer MUX to switch to the multiplexer output the second clock signal clk2, which is generated by the phase locked loop 2 and is present at a further multiplexer input of the multiplexer MUX. As is shown in the figure, the output of the multiplexer MUX is coupled to the inputs of a plurality of output drivers 4.1–4.4.

In the case of the exemplary embodiment illustrated in the figure, only the two output drivers 4.1 and 4.2 are used, the outputs 1.2 and 1.3 thereof, which simultaneously form the outputs of the integrated chip 1, being connected to the clock input 5.1 of the first memory chip 5 and the clock input 6.1 of the second memory chip 6, respectively. With the aid of the output drivers 4.1 to 4.4, the clock signal—either clk1 or clk2—originating from the multiplexer output is amplified and it is ensured that it is available to the memory chips 5 and 6 with sufficient quality. In another embodiment, the clock could be bussed so that one clock signal (e.g., from output 1.2 or 1.3) is coupled to more than one memory chip.

In normal operation, with the aid of the phase locked loop 2, the second clock signal clk2 is obtained from the first clock signal clk1, and is passed via the multiplexer MUX and the corresponding output drivers 4.1 to 4.4 to the clock inputs of the memory chips 5 and 6.

During test operation, that is to say for the case where the clock frequency f(clk1) of the first clock signal clk1 is so much less than the operating frequency of the phase locked loop 2 that the latter can no longer operate properly, the unit for frequency monitoring 3 causes the multiplexer MUX to switch the first clock signal clk1 through to the multiplexer output. This is the case if the clock frequency f(clk1) of the first clock signal clk1 is less than the limiting frequency fmin. The clock signal clk2 generated by the phase locked loop 2 is ignored in this way, that is to say that the phase locked loop 2 is switched into a bypass mode. The changeover to the bypass mode may be triggered by the integrated clock supply chip itself as soon as a specific minimum frequency fmin is undershot at the clock input.

If the clock frequency clk for operating a memory chip is clk=133 MHz, for example, then the phase locked loop 2 generally operates properly in a frequency band of +/−30% above and below the clock frequency of 133 MHz. The limiting frequency fmin thus results therefrom as:

$$f\min = 0.7 f(clk1)$$

It thus becomes possible to test the memory chips 5 and 6 properly, even if the first clock frequency clk1 lies below the limiting frequency fmin required for proper operation of the phase locked loop 2. The determination or the testing of the retention time during the productive test can thus be carried out successfully even on a cost-effective test system which generally can only provide relatively lower clock frequencies. Moreover, it is also no longer necessary for memory chips that are to be examined for defect analysis after a failure to be unordered from the memory module in order thereby to be able to be tested on a cost-effective test system. Obviating the desoldering operation results in a significantly improved capability for analysis of the memory module and additionally a corresponding time saving.

With the aid of the invention, there is no need for any modification to the memory module itself. The preferred embodiment therefore has the advantage over alternative solutions that additional components, such as e.g., resistors, or a redesign of the memory module can be avoided. Consequently, neither additional costs nor possibly problems with regard to reliability arise. A further advantage is that the standards to which the memory modules are subject and which are mentioned in the introduction do not have to be modified.

The previous description of the exemplary embodiments in accordance with the present invention serves only for illustrative purposes and not for the purpose of restricting the invention. Various changes and modifications are possible in the context of the invention without departing from the scope of the invention.

Although the present invention and its advantages have been described in detail, it should be understood that various changes, substitutions and alterations can be made herein without departing from the spirit and scope of the invention as defined by the appended claims.

What is claimed is:

1. An integrated circuit comprising:
   a clock signal input node for providing a first clock signal;
   a phase locked loop with an input coupled to the clock signal input node for receiving said first clock signals and for providing a second clock signal;
   a multiplexer having a first input, a second input, a select input and an output, the first input being coupled to an output of the phase locked loop for receiving said second clock signal, and the second input being coupled to the clock signal input node for receiving said first clock signal, said select input for receiving a control signal for switching the output of said multiplexer between said first clock signal and said second clock signal; and
   a frequency monitor having an input coupled to the clock signal input node for comparing the frequency of said first clock signal to a selected limiting frequency and a monitor output coupled to said select input of the multiplexer, said monitor output providing said control signal to switch said multiplexer output to said first clock signal if the frequency of said first clock signal is less than said selected limiting frequency and to switch said multiplexer output to said second clock signal if the frequency of said first clock signal is greater than said selected limiting frequency.

2. The circuit of claim 1 and further comprising an output driver coupled to an output of the multiplexer.

3. The integrated circuit of claim 1 in combination with a memory chip, wherein the integrated circuit and the memory chip are mounted on a board, and wherein an output of the multiplexer is coupled to a clock input of the memory chip.

4. The integrated circuit and memory chip combination of claim 3, wherein the memory chip comprises a dynamic random access memory chip.

5. The integrated circuit and memory chip combination of claim 4, wherein the memory chip and the integrated circuit are part of a dual inline memory module.

6. The integrated circuit and memory chip combination of claim 3, further comprising a second memory chip disposed on the circuit board, the second memory chip having a clock input that is coupled to receive a clock signal from the integrated circuit.

7. The integrated circuit and memory chip combination of claim 6, wherein the integrated circuit includes a first output buffer coupled to the output of the multiplexer and a second output buffer coupled to the output of the multiplexer, wherein the first output buffer is coupled to the clock input of the memory chip and the second output buffer is coupled to the clock input of the second memory chip.

8. An integrated clock supply chip for a memory module comprising:
   a clock signal input for application of a first clock signal and a clock signal output;
   a phase locked loop that, on the input side, is coupled to the clock signal input, the phase locked loop generating a second clock signal;
   a multiplexer for switching the clock signal output between the first clock signal and the second clock signal in response to a control signal; and
   a frequency monitor with an input side coupled to the clock signal input, the frequency monitor for comparing the frequency of the first clock signal to a selected limiting frequency and for providing said control signal to said multiplexer to switch the first clock signal to the clock signal output if the frequency of said first clock signal is less than said selected limiting frequency and to switch the second clock signal to said clock signal output if the frequency of said first clock signal is greater than said selected limiting frequency.

9. The integrated clock supply chip as claimed in claim 8, and further comprising an output driver coupled downstream of the multiplexer.

10. An integrated circuit comprising:
    a clock signal input node;
    a phase locked loop with an input coupled to the clock signal node;
    a multiplexer having a first input and a second input, the first input being coupled to an output of the phase locked loop and the second input being coupled to the clock signal input node; and a frequency comparator with an input coupled to the clock signal node, the frequency comparator configured to receive a clock signal from the clock signal input node and generate a select signal that has a first value if the clock signal has a frequency less than a reference frequency and a second value if the clock signal has a frequency greater than the reference frequency, the frequency comparator further including an output carrying the select signal and being coupled to a control input of the multiplexer;

wherein the multiplexer includes an output that outputs the clock signal when the select signal has the first value and outputs a phase-locked version of the clock signal when the select signal has the second value.

11. The integrated circuit of claim 10, wherein the reference frequency is about 93 MHz.

12. The integrated circuit of claim 10, further comprising an output driver coupled to the output of the multiplexer.

13. The integrated circuit of claim 10 in combination with a memory chip, wherein the integrated circuit and the memory chip are mounted on a board, and wherein the output of the multiplexer is coupled to a clock input of the memory chip.

14. The integrated circuit of claim 10, further comprising a first output driver coupled to the output of the multiplexer and a second output driver coupled to the output of the multiplexer.

15. The integrated circuit of claim 14 in combination with a first memory chip and a second memory chip, wherein the integrated circuit, the first memory chip and the second memory chip are mounted on a board, and wherein the first memory chip includes a clock input coupled to the first output driver and the second memory chip includes a clock input coupled to the second output driver.

16. The combination of claim 15, wherein the integrated circuit, the first memory chip and the second memory chip are part of a dual inline memory module.

* * * * *